US009190549B2

(12) United States Patent
Chen et al.

(10) Patent No.: US 9,190,549 B2
(45) Date of Patent: Nov. 17, 2015

(54) SOLAR CELL MADE USING A BARRIER LAYER BETWEEN P-TYPE AND INTRINSIC LAYERS

(75) Inventors: Tze-Chiang Chen, Yorktown Heights, NY (US); Augustin J. Hong, White Plains, NY (US); Chien-Chih Huang, Pingtung (TW); Yu-Wei Huang, Tainan (TW); Jeehwan Kim, Los Angeles, CA (US); Devendra K. Sadana, Pleasantville, NY (US); Chih-Fu Tseng, Tainan (TW)

(73) Assignees: INTERNATIONAL BUSINESS MACHINES CORPORATION, Armonk, NY (US); BAY ZU PRECISION CO., LTD, Tainan (TW)

( * ) Notice: Subject to any disclaimer, the term of this patent is extended or adjusted under 35 U.S.C. 154(b) by 549 days.

(21) Appl. No.: 13/406,815

(22) Filed: Feb. 28, 2012

(65) Prior Publication Data
US 2013/0221373 A1 Aug. 29, 2013

(51) Int. Cl.
H01L 31/07 (2012.01)
H01L 31/18 (2006.01)
H01L 31/075 (2012.01)
H01L 31/20 (2006.01)

(52) U.S. Cl.
CPC .......... *H01L 31/075* (2013.01); *H01L 31/1804* (2013.01); *H01L 31/202* (2013.01); *Y02E 10/547* (2013.01); *Y02E 10/548* (2013.01)

(58) Field of Classification Search
None
See application file for complete search history.

(56) References Cited

U.S. PATENT DOCUMENTS

| 3,139,568 | A | * | 6/1964 | Ishikawa et al. | 361/524 |
|---|---|---|---|---|---|
| 3,448,354 | A | * | 6/1969 | Cohen | 257/586 |
| 5,180,434 | A | | 1/1993 | Didio et al. | |
| 5,507,881 | A | | 4/1996 | Sichanugrist et al. | |
| 5,790,304 | A | | 8/1998 | Sanders et al. | |
| 6,127,266 | A | * | 10/2000 | Ouellet et al. | 438/643 |
| 8,252,624 | B2 | * | 8/2012 | Tanner et al. | 438/96 |
| 2011/0057276 | A1 | * | 3/2011 | Meier et al. | 257/431 |
| 2011/0079241 | A1 | * | 4/2011 | Sinha et al. | 134/1.1 |
| 2011/0088760 | A1 | | 4/2011 | Sheng et al. | |
| 2011/0129954 | A1 | * | 6/2011 | Kupich et al. | 438/57 |
| 2011/0174362 | A1 | | 7/2011 | Tanner et al. | |
| 2011/0177648 | A1 | * | 7/2011 | Tanner et al. | 438/72 |
| 2011/0203652 | A1 | | 8/2011 | Tsai | |

FOREIGN PATENT DOCUMENTS

WO WO2011076466 A2 6/2011

OTHER PUBLICATIONS

Ballutaud, J., et al. "Reduction of the Boron Cross-Contamination for Plasma Deposition of P-I-N Devices in a Single-Chamber Large Area Radio-Frequency Reactor" Thin Solid Films, vol. 468, Issues 1-2. Dec. 2004. pp. 222-225.
Chen, T., et al. "Notification of Transmittal of the International Search Report and Written Opinion of the International Searching Authority" Issued for PCT/US2013/028235 on May 3, 2013. (14 Pages).

* cited by examiner

*Primary Examiner* — Mamadou Diallo
(74) *Attorney, Agent, or Firm* — Tutunjian & Bitetto, P.C.; Louis J. Percello

(57) ABSTRACT

A method for forming a photovoltaic device includes depositing a p-type layer on a substrate. A barrier layer is formed on the p-type layer by exposing the p-type layer to an oxidizing agent. An intrinsic layer is formed on the barrier layer, and an n-type layer is formed on the intrinsic layer.

20 Claims, 6 Drawing Sheets

SOLAR CELL MADE USING A BARRIER LAYER BETWEEN P-TYPE AND INTRINSIC LAYERS

BACKGROUND

1. Technical Field

The present invention relates to solar cells, and more particularly to devices and methods which employ a barrier layer between p-type layer formation and intrinsic layer formation.

2. Description of the Related Art

Fabrication of amorphous hydrogenated silicon (a-Si:H) solar cells is performed with the deposition of constituent active layers. The active layers include a p-type layer (or p-layer), an intrinsic layer (or i-layer) and an n-type layer (or n-layer), collectively a p-i-n or pin stack.

In some processes, a surface of the active layer is exposed to reactant by-products that may be present in the chamber or may be left over from previous processing. While solar cell fabrication using a single chamber is manufacturing friendly, this process suffers from the drawback of different species of elements or compounds being left over from previous processing. For example, when diborane is used for a p-type dopant source (e.g., boron), boron is left over in the chamber. If further processing is conducted in the same chamber a higher probability of contamination occurs, which can result in poor device performance.

In another example, trimethylborane(TMB) may be employed as a p-type dopant source. In this case, less boron is left over after depositing p-type a-SiC:H. However, for other materials, e.g., a-Ge:H, a-Si:H, etc., it is extremely difficult to provide boron to these films without contaminating reactants being present (the process is not flexible for all device materials). These contaminants usually settle at interfaces and affect device performance.

SUMMARY

A method for forming a photovoltaic device includes depositing a p-type layer on a substrate. A barrier layer is formed on the p-type layer by exposing the p-type layer to an oxidizing agent. An intrinsic layer is formed on the barrier layer, and an n-type layer is formed on the intrinsic layer.

Another method for forming a photovoltaic device includes forming a transparent conductive electrode on a transparent substrate; depositing a p-type layer including silicon doped with boron on the transparent conductive electrode; forming an oxide layer on the p-type layer by exposing a surface of the p-type layer to oxygen; forming an intrinsic layer on the oxide layer; and forming an n-type layer on the intrinsic layer.

A photovoltaic device includes a transparent conductive electrode formed on a transparent substrate. A p-type layer includes silicon doped with boron formed on the transparent conductive electrode. A barrier layer includes an oxide formed at a surface of the p-type layer. An intrinsic layer is formed on the barrier layer. An n-type layer is formed on the intrinsic layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
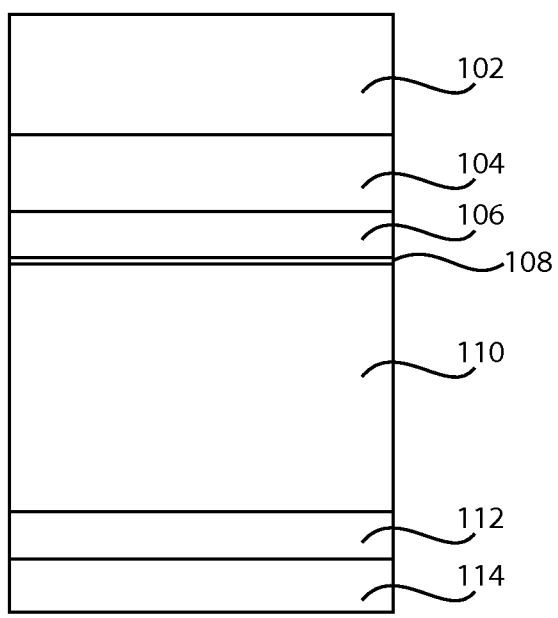
FIG. 1 is a cross-sectional view of a photovoltaic device including a barrier layer in accordance with the present principles.

In accordance with the present principles, devices and methods are provided that result in improved device efficiency and performance. Photovoltaic devices, such as solar cells and the like, employ active layers that include a p-type layer (or p-layer), an intrinsic layer (or i-layer) and an n-type layer (or n-layer), collectively a p-i-n or pin stack. The present principles provide an intentionally formed barrier layer on the p-type layer prior to the formation of the i-layer. The barrier layer, which may include an oxide, may be naturally formed in an ambient environment that includes oxygen or the surface may be treated using an oxidizing agent, such as oxygen plasma. Oxygen is convenient for silicon-based films; however, devices using other materials may benefit from other types of films or layers.

In one embodiment, the p-type layer is formed by a deposition process in a processing chamber on a device or sample. The sample is then unloaded from the chamber and subjected to ambient conditions (e.g., exposed to air). This exposure may be referred to as an air break. The chamber is cleaned to remove any remaining p-type compounds. The sample is then reloaded to continue processing by forming the intrinsic layer and the n-type layer. This provides the option of employing a single chamber for multiple layer processing.

In another embodiment, the sample is not removed from the chamber and instead, the sample is exposed to an oxidizer, such as oxygen plasma, or other substance. The processing may continue in the same chamber by forming the intrinsic layer and the n-type layer.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case the devices/chips are then integrated with other chips, discrete circuit elements, and/or other signal processing devices as part of either (a) an intermediate product, such as a motherboard, or (b) an end product. The end product can be any product that includes photovoltaic devices, ranging from toys, energy collectors, solar devices and other applications including computer products or devices having a display, a keyboard or other input device, and a central processor.

It should be further understood that material compounds will be described in terms of listed elements, e.g., SiC, SiGe, etc. These compounds include different proportions of the elements within the compound, e.g., $Si_xC_y$, where $x/y \neq 1$, etc. In addition, other elements may be included in the compound and still function in accordance with the present principles.

The present embodiments may be part of a photovoltaic device or circuit, and the circuits as described herein may be part of a design for an integrated circuit chip, a solar cell, a light sensitive device, etc.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials. For the present example, a doped zinc oxide is illustratively employed for electrode 104. The TCO 104 permits light to pass through to an active light-absorbing material beneath and allows conduction to transport photo-generated charge carriers away from that light-absorbing material. The TCO 104 may be deposited by a chemical vapor deposition (CVD) process, a plasma-enhanced (PE-CVD), etc.

The light-absorbing material includes a doped p-type layer 106 (e.g., a doped amorphous silicon (a-Si), a doped amorphous silicon carbide, microcrystalline silicon (µc-Si) layer, etc.). In this illustrative structure 100, layer 106 is formed on electrode 104. In one embodiment, p-type layer 106 includes boron as a dopant, although other p-type dopants may be employed. Layer 106 may be deposited by a chemical vapor deposition (CVD) process, or a plasma-enhanced (PE-CVD) using diborane or trimethylborane (TMB) gas. The p-type layer 106 may have a thickness of between about 5-20 nm. In particularly useful embodiments, layer 106 includes amorphous SiC. Other materials may be employed as well, e.g., amorphous Si, microcrystalline Si, etc.

An interface barrier layer 108 is formed on the p-type layer 106. The barrier layer 106 can protect an intrinsic layer 110 from contamination species that may form at the p-type layer/intrinsic layer interface. Barrier layer 108 may include an oxide layer formed by exposing the p-type layer 106 to air or to an oxidizing treatment. In particularly useful embodiments, the barrier layer 108 may be formed by, e.g., a 5-10 minute exposure to an ambient environment or by exposing the p-type layer 106, e.g., to a 25 watt power, oxygen plasma for 2 seconds. Other processes may also be employed. The barrier layer 108 may include one or more monolayers (e.g., 1 to about 20, although more layers may be employed) in thickness. In one example, silicon in layer 106 may form a silicon oxide 0.20-2.0 nm in thickness.

The barrier layer 106 may be formed by providing an air break during the fabrication process. This may include, after forming the p-type layer 106, removing the device 100 from a processing chamber in ambient air. In an alternative embodiment, the device 100 is left in the chamber and exposed to air. In still another embodiment, the device 100 is left in the chamber and exposed to oxygen plasma or other oxidizing agent.

It should be understood that the chamber may include boron reactants and by-products that remain in the chamber after the deposition of layer 106. There is potential that these materials can contaminate the intrinsic layer (110), which is formed on or over the p-type layer 106. In one embodiment, the chamber is purged, in particular, using fluorine based materials to clean the chamber by reacting with the boron based materials.

The intrinsic layer 110 of compatible material is formed on layer 108. Intrinsic layer 110 may be undoped and may include an amorphous silicon material, e.g., hydrogenated amorphous Si (a-Si:H). The intrinsic layer 110 may include a thickness of between about 100-300 nm, although other thicknesses are contemplated. The intrinsic layer 110 may include a-Si:H or a hydrogenated amorphous silicon carbide (a-SiC:H) and may be deposited by a chemical vapor deposition (CVD) process, or a plasma-enhanced (PE-CVD) using silane gas and hydrogen gas.

In one embodiment, a doped layer 112 (e.g., an n-type layer) is formed on the intrinsic layer 110. Layer 112 may include an n-type hydrogenated microcrystalline (µc-Si:H) or a-Si layer. Layer 112 may be deposited by a chemical vapor deposition (CVD) process, or a plasma-enhanced (PE-CVD). The n-type layer 112 may have a thickness of between about 5-20 nm. A back reflector and/or bottom electrode 114 may be formed by a reflective metal, such as Ag, Al, Au, etc. A suitable metal deposition process may be employed, e.g., physical or chemical vapor deposition, sputtering, electro or electroless plating, etc.

It should be understood that other material selections, layers, structure, etc. may be employed in device 100. These different combinations may benefit from an interface barrier layer 108 as described herein in accordance with the present principles. The barrier layer 108 provides an increase in open circuit voltage over devices fabricated without the barrier layer 108. The following FIGS. will present illustrative experimental results for showing improvements from a device having a barrier layer 108 formed during the fabrication process in accordance with the present principles.

A solar cell may be described in terms of a fill factor (FF). FF is a ratio of the maximum power point ($P_m$) divided by open circuit voltage ($V_{oc}$) and short circuit current $$(J_{sc}): FF = \frac{P_m}{V_{oc}J_{sc}}.$$

Higher open circuit voltage provides greater efficiency if other parameters remain the same. Increased efficiency of photovoltaic devices even by a portion of one percent is of utmost importance in the present energy environment.

Figure 2:
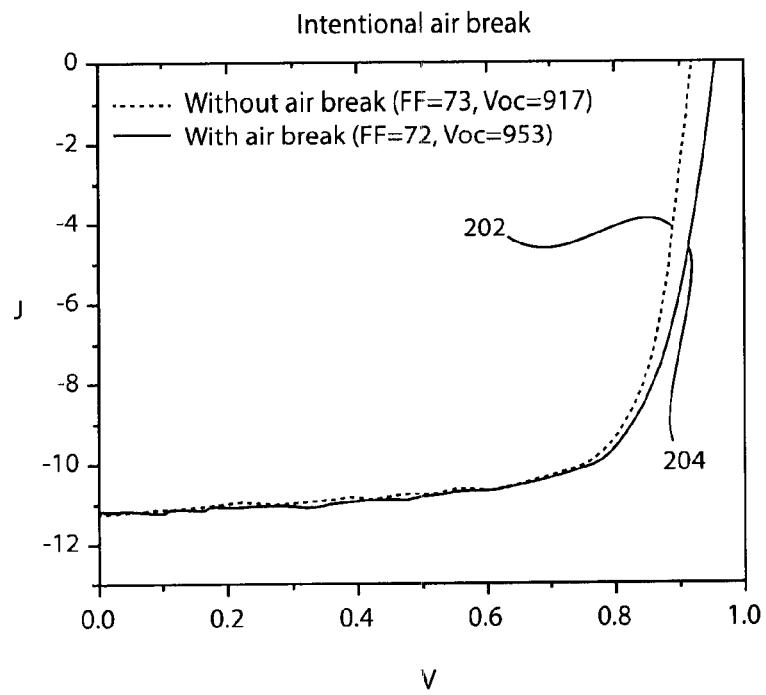
FIG. 2 are plots showing current density (J) (mA/cm$^2$) versus voltage (V) (volts) for photovoltaic devices with and without an intentional air break in accordance with the present principles.

Referring to FIG. 2, plots of current density J (mA/cm$^2$) versus voltage (V) (volts) for a device without an air break (plot 202), and a device with a five minute air break (forming a barrier layer on the p-type layer at the p-type layer to intrinsic layer interface (p-i interface) (plot 204). As can be seen from the plot in FIG. 2, the open circuit voltage ($V_{oc}$) is enhanced by approximately 4% in this embodiment. Other improvements are also contemplated, which may be greater than or less than the 4% described in the example. The $V_{oc}$ is 953 mV for the device with the air break (plot 204) and $V_{oc}$ is 917 mV for the device without the air break (plot 202). The FF is maintained between these devices, e.g., FF=73 for plot 202 and FF=72 for plot 204.

It should be understood that different process parameters may be employed to provide better results. Different process parameters will be illustratively presented hereinafter.

Figure 3:
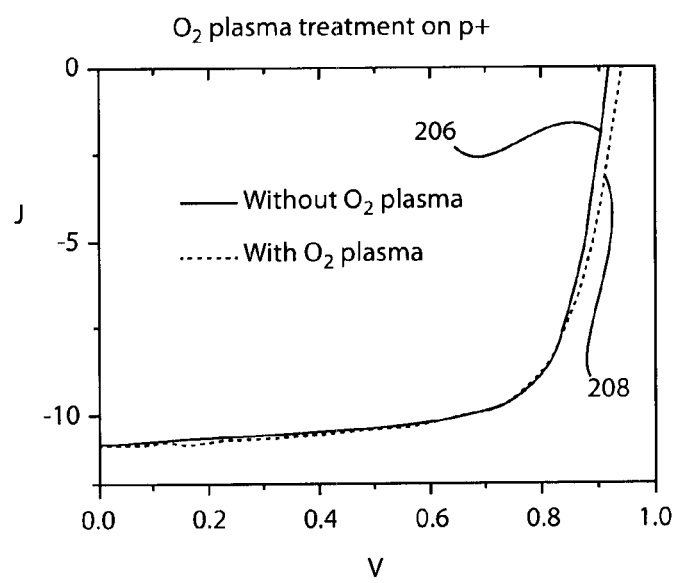
FIG. 3 are plots showing current density (J) (mA/cm$^2$) versus voltage (V) (volts) for photovoltaic devices with and without an oxygen plasma treatment in accordance with the present principles.

Referring to FIG. 3, plots of current density J (mA/cm$^2$) versus voltage (V) (volts) for a device without an oxygen plasma (plot 206) process, and a device with an oxygen plasma process (forming a barrier layer on the p-type layer at the p-i interface (plot 208). As can be seen from the plot in FIG. 3, the $V_{oc}$ is again enhanced by approximately 4% in this embodiment. The FF remains comparable between these devices. The oxygen plasma process includes exposing the p-type layer (106) to ionized oxygen gas to form the barrier layer. The device remained within the processing chamber for deposition of the p-type layer (106) and the formation of the barrier layer (108). Further, the intrinsic layer (110) may be formed subsequently to the oxygen plasma treatment while the device remains in the same chamber.

Figure 4:
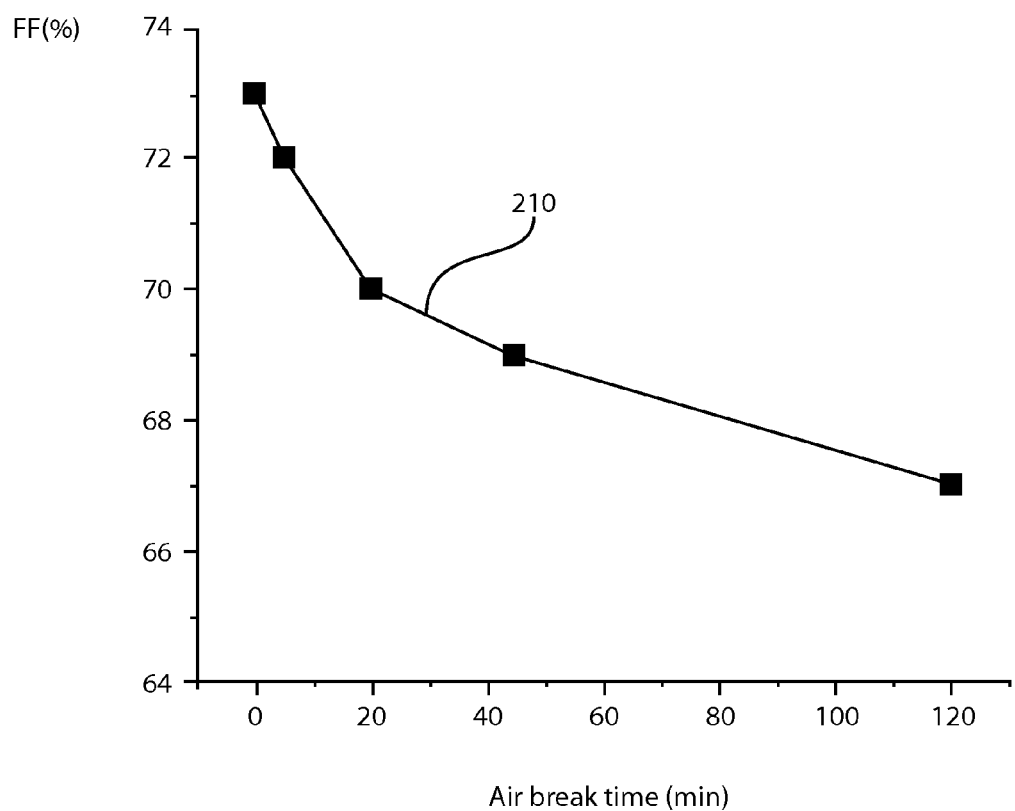
FIG. 4 is a plot showing fill factor (FF) (%) versus air break time (min) for photovoltaic devices having a barrier layer in accordance with the present principles.

Referring to FIG. 4, a plot 210 of data points of FF (%) versus air break time (minutes) is illustratively shown. As can be seen from FIG. 4, the FF drops off rapidly with time. However, FF is maintained at higher than 70% for over 10 minute durations in air break times. Such durations do not degrade overall efficiency of the device significantly.

Figure 5:
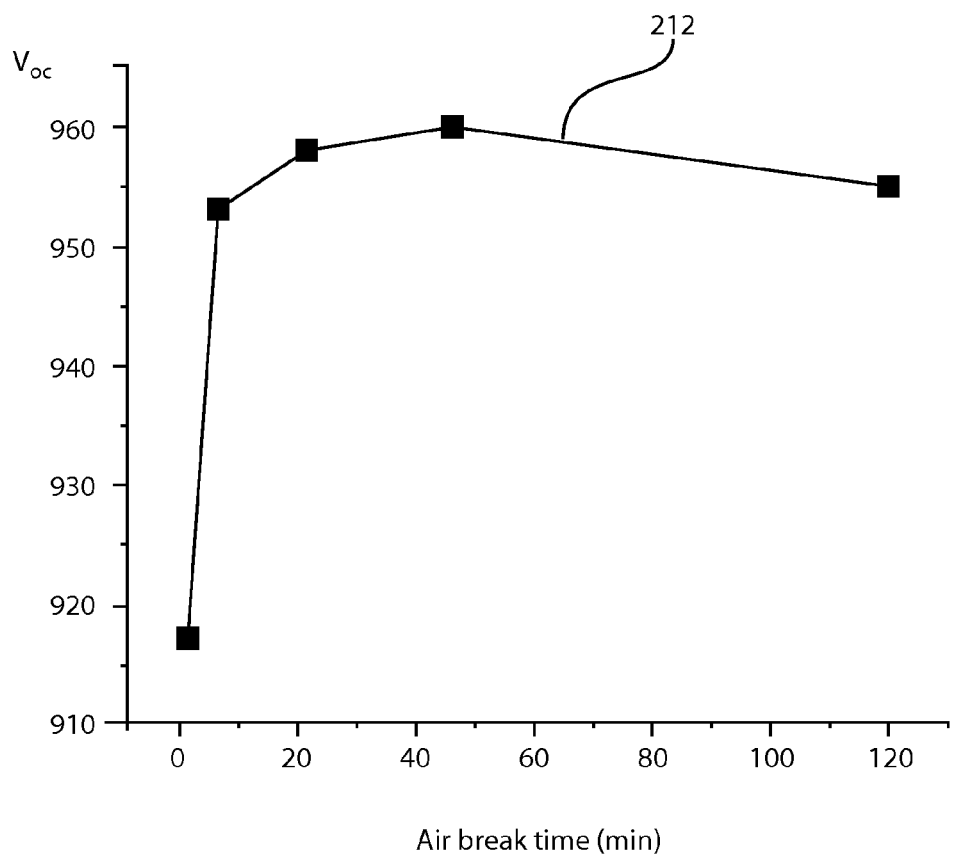
FIG. 5 is a plot showing open circuit voltage ($V_{OC}$) (mV) versus air break time (min) for photovoltaic devices having a barrier layer in accordance with the present principles.

Referring to FIG. 5, a plot 212 of data points of $V_{oc}$ (mV) versus air break time (minutes) is illustratively shown. As can be seen from FIG. 5, the $V_{oc}$ increases dramatically and then levels off with time. From FIGS. 4 and 5, the amount of time for an air break should be less than about 20 minutes and preferably less than about 10 minutes and more preferably less than about 5 minutes to balance FF loss against enhanced $V_{oc}$.

In one illustrative example, a device with no air break included FF=73, $V_{oc}$=917 mV. A device with a 5 minute air break included FF=72, $V_{oc}$=953 mV. A device with a 20 minute air break included FF=70, $V_{oc}$=958 mV. A device with a 45 minute air break included FF=69, $V_{oc}$=960 mV. Generally, FF degrades while $V_{oc}$ increases with air break time.

Figure 6:
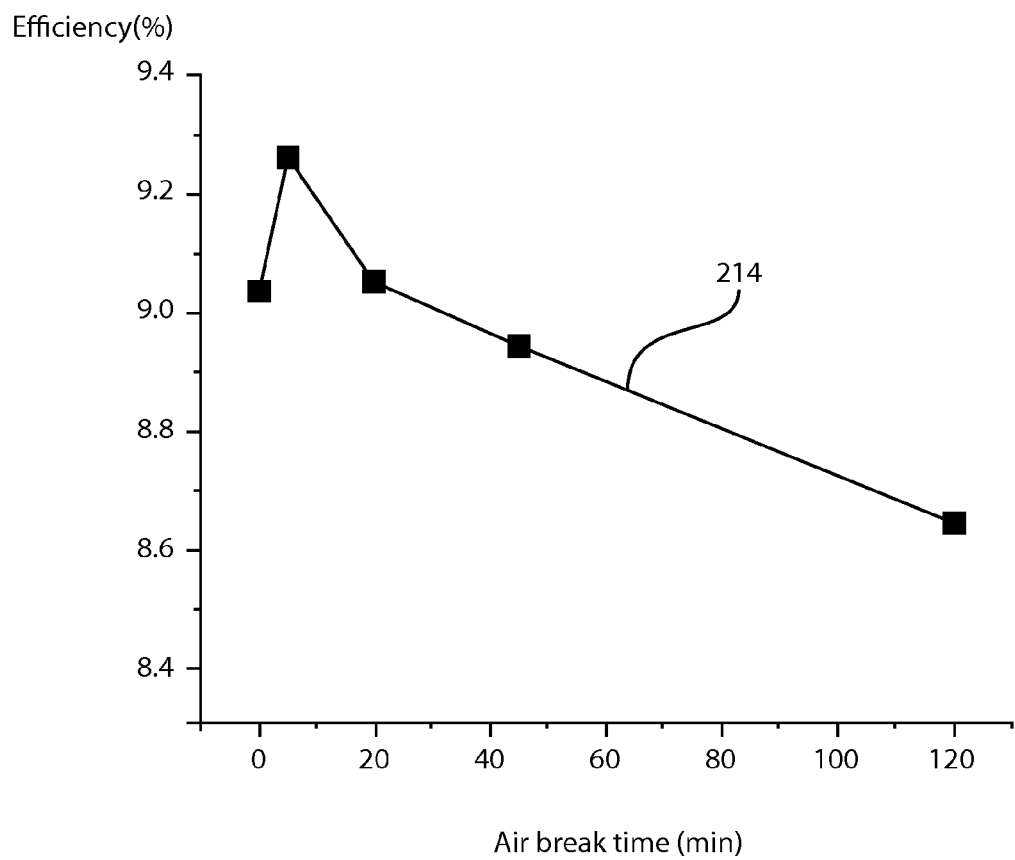
FIG. 6 is a plot showing device efficiency (%) versus air break time (min.) in accordance with the present principles.

Referring to FIG. 6, a plot 214 of device efficiency (%) versus air break time (minutes) is illustratively depicted. As can be seen from FIG. 6, the device efficiency increases within the first 10 minutes or so of an air break. Increased efficiency can be achieved in the first 20 minutes or so over a device made with no air break.

Figure 7:
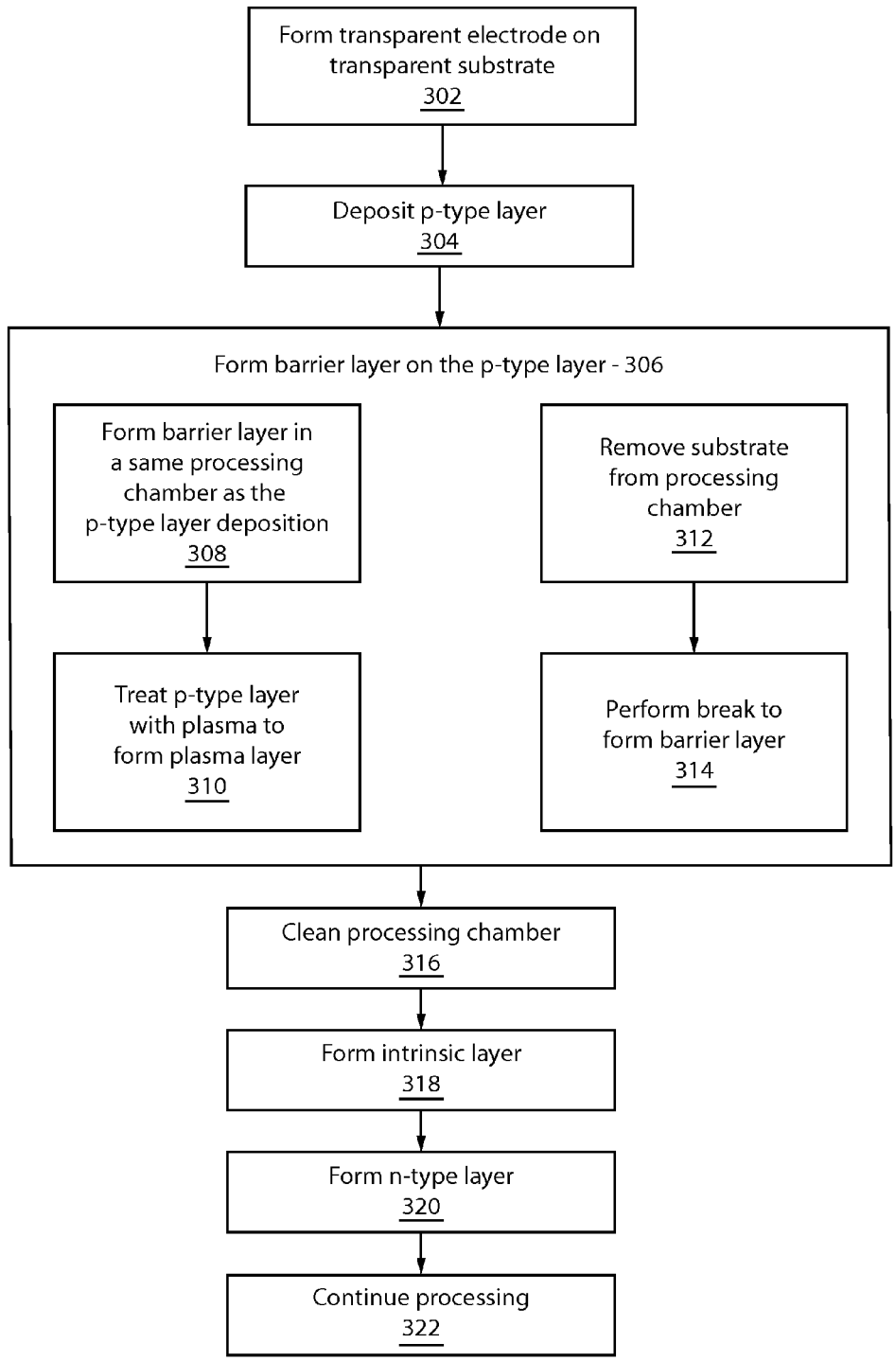
FIG. 7 is a block/flow diagram showing methods for fabricating a photovoltaic device in accordance with illustrative embodiments.

Referring to FIG. 7, a method for forming a photovoltaic device is shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a transparent conductive electrode is formed on a transparent substrate. In block 304, a p-type layer is deposited on the transparent conductive electrode or on the substrate. In one embodiment, the p-type layer includes silicon containing material (e.g., a-Si or a-SiC) doped with boron. In block 306, a barrier layer is formed on the p-type layer. The barrier layer may include an oxide or other material to act as a diffusion barrier between the p-type layer and the intrinsic layer. In one embodiment, the barrier layer is formed by exposing a surface of the p-type layer to oxygen. In one embodiment, the oxide layer includes between 1 to about 20 monolayers of oxide.

In block 308, in one embodiment, the barrier layer is formed in a same processing chamber where the p-type layer is deposited. In block 310, the oxide layer is formed by treating the p-type layer with oxygen plasma. This avoids the need for removing the device from the chamber to form the barrier layer.

In another embodiment, the barrier layer is formed by removing the substrate with the p-type layer from a processing chamber in block 312, and performing an air break or exposure break where the p-type layer is exposed to form the barrier layer in block 314. The air break may include exposing the p-type layer to ambient air conditions. The air break may include exposing the p-type layer for less than about 20 minutes, and more preferably for less than about 5 minutes. Since the FF may decrease with exposure time and $V_{oc}$ increases greatly initially and then levels off as described above, exposure time should be optimized to achieve the best results for a given device structure and application.

In block 316, the processing chamber may be cleaned with a fluorine-based gas before placing the substrate with the p-type layer back into the chamber. The fluorine-based gas may include $NF_3$, $SF_6$, $CF_4$, etc.

In block 318, an intrinsic layer is formed on the barrier layer. The intrinsic layer may include, e.g., undoped a-Si. The formation of the barrier layer protects the intrinsic layer from exposure to contaminant by-products (e.g., from boron containing compounds, etc.) formed during the deposition of the p-type layer. In block 320, an n-type layer is formed on the intrinsic layer. The n-type layer may include a-Si doped with an n-type dopant (e.g., P).

In block 322, processing continues to form other layers (e.g., a back-reflector, etc.), other structures, etc. and to complete the fabrication of the device(s).

Having described preferred embodiments of a solar cell made using a barrier layer between p-type and intrinsic layers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
depositing a p-type layer on a substrate;
forming a substantially undoped barrier layer on the p-type layer by exposing the p-type layer to an oxidizing agent by removing the substrate with the p-type layer from a processing chamber, and performing an exposure break in an oxidizing environment to form the barrier layer, wherein said performing the exposure break includes exposing the p-type layer for less than about 20 minutes;
forming an intrinsic layer on the barrier layer; and
forming an n-type layer on the intrinsic layer.

2. The method as recited in claim 1, wherein forming the barrier layer is performed in a same processing chamber as depositing the p-type layer.

3. The method as recited in claim 2, wherein forming the barrier layer includes treating the p-type layer with oxygen plasma.

4. The method as recited in claim 1, wherein performing the exposure break includes exposing the p-type layer to ambient air conditions.

5. The method as recited in claim 1, wherein performing the exposure break includes exposing the p-type layer for less than about 5 minutes.

6. The method as recited in claim 1, wherein forming a barrier layer includes forming an oxide on the p-type layer to protect the intrinsic layer from exposure to contaminant byproducts formed during the deposition of the p-type layer.

7. The method as recited in claim 6, wherein the oxide includes between 1 to about 20 monolayers of the oxide.

8. A method for forming a photovoltaic device, comprising:
forming a transparent conductive electrode on a transparent substrate;
depositing a p-type layer including silicon doped with boron on the transparent conductive electrode;
forming an oxide layer on the p-type layer by exposing a surface of the p-type layer to oxygen by removing the substrate with the p-type layer from a processing chamber, and performing an exposure break in an oxidizing environment to form the barrier layer, wherein said performing the exposure break includes exposing the p-type layer for less than about 20 minutes, wherein the oxide layer is substantially free of p-type dopant, n-type dopant or a combination thereof;
forming an intrinsic layer on the oxide layer; and
forming an n-type layer on the intrinsic layer.

9. The method as recited in claim 8, wherein forming the barrier layer is performed in a same processing chamber as depositing the p-type layer.

10. The method as recited in claim 9, wherein forming the oxide layer includes treating the p-type layer with oxygen plasma.

11. The method as recited in claim 8, wherein performing the air break includes exposing the p-type layer to ambient air conditions.

12. The method as recited in claim 8, wherein performing the air break includes exposing the p-type layer for less than about 5 minutes.

13. The method as recited in claim 8, further comprising cleaning the chamber with a fluorine-based gas before placing the substrate with the p-type layer back into the chamber.

14. The method as recited in claim 8, wherein forming the oxide layer includes forming the oxide layer to protect the intrinsic layer from exposure to contaminant boron by-products formed during the deposition of the p-type layer.

15. The method as recited in claim 8, wherein the oxide layer includes between 1 to about 20 monolayers of oxide.

16. A photovoltaic device, comprising:
a transparent conductive electrode formed on a transparent substrate;
a p-type layer including silicon doped with boron formed on the transparent conductive electrode;
a barrier layer including an oxide having a thickness of 20 monolayers or less formed at a surface of the p-type layer, wherein the barrier layer is free of p-type dopant, n-type dopant or a combination thereof;
an intrinsic layer formed on the barrier layer; and
an n-type layer formed on the intrinsic layer.

17. The device as recited in claim 16, wherein the oxide includes between 1 to about 20 monolayers of oxide.

18. The device as recited in claim 16, wherein the p-type layer includes amorphous SiC and the intrinsic layer and the n-type layer include amorphous Si.

19. The device as recited in claim 16, wherein the oxide layer is configured to protect the intrinsic layer from exposure to contaminant boron by-products formed during the deposition of the p-type layer.

20. The device as recited in claim 16, wherein the barrier layer increases open circuit voltage of the device by at least four percent.

* * * * *